(12) United States Patent
Chan et al.

(10) Patent No.: US 7,738,249 B2
(45) Date of Patent: Jun. 15, 2010

(54) CIRCUITIZED SUBSTRATE WITH INTERNAL COOLING STRUCTURE AND ELECTRICAL ASSEMBLY UTILIZING SAME

(75) Inventors: Benson Chan, Vestal, NY (US); Frank D. Egitto, Binghamton, NY (US); How T. Lin, Vestal, NY (US); Roy H. Magnuson, Endicott, NY (US); Voya R. Markovich, Endwell, NY (US); David L. Thomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 75 days.

(21) Appl. No.: 11/976,468

(22) Filed: Oct. 25, 2007

(65) Prior Publication Data

US 2009/0109624 A1 Apr. 30, 2009

(51) Int. Cl.
*H05K 7/20* (2006.01)
(52) U.S. Cl. .................. 361/679.53; 361/698; 361/699; 361/704; 361/719; 361/720; 165/104.33; 165/80.4; 29/830; 428/209; 428/901; 174/15.1; 174/16.1; 174/258; 174/261; 174/262; 174/264; 257/714; 257/721; 257/E23.098
(58) Field of Classification Search ......... 361/698–712, 361/715–722; 257/713–715; 165/80.2, 80.4, 165/80.5, 104.33, 185; 174/15.1, 16.3, 252; 29/830, 890.03, 840
See application file for complete search history.

(56) References Cited

U.S. PATENT DOCUMENTS

| | | | |
|---|---|---|---|
| 4,150,421 A * | 4/1979 | Nishihara et al. | 361/778 |
| 4,394,712 A * | 7/1983 | Anthony | 361/779 |
| 4,706,164 A | 11/1987 | L'Henaff et al. | |
| 4,729,061 A * | 3/1988 | Brown | 361/719 |
| 5,142,441 A * | 8/1992 | Seibold et al. | 361/689 |
| H1471 H * | 8/1995 | Braun et al. | 361/704 |
| 5,741,729 A * | 4/1998 | Selna | 438/125 |
| 5,874,369 A * | 2/1999 | Farooq et al. | 438/707 |
| 5,875,097 A | 2/1999 | Amaro et al. | |
| 5,929,518 A | 7/1999 | Schlaiss | |

(Continued)

FOREIGN PATENT DOCUMENTS

DE 19711533 A1 * 9/1998

(Continued)

*Primary Examiner*—Michael V Datskovskiy
(74) *Attorney, Agent, or Firm*—Mark Levy; Lawrence R. Fraley; Hinman, Howard & Kattell

(57) ABSTRACT

An electrical assembly which includes a circuitized substrate including a first plurality of dielectric and electrically conductive circuit layers alternatively oriented in a stacked orientation, a thermal cooling structure bonded to one of the dielectric layers and at least one electrical component mounted on the circuitized substrate. The circuitized substrate includes a plurality of electrically conductive and thermally conductive thru-holes located therein, selected ones of the thermally conductive thru-holes thermally coupled to the electrical component(s) and extending through the first plurality of dielectric and electrically conductive circuit layers and being thermally coupled to the thermal cooling structure, each of these selected ones of thermally conductive thru-holes providing a thermal path from the electrical component to the thermal cooling structure during assembly operation. The thermal cooling structure is adapted for having cooling fluid pass there-through during operation of the assembly. A method of making the substrate is also provided.

22 Claims, 3 Drawing Sheets

U.S. PATENT DOCUMENTS

| | | | |
|---|---|---|---|
| 5,998,240 A | 12/1999 | Hamilton et al. | |
| 6,004,619 A * | 12/1999 | Dippon et al. | 29/852 |
| 6,032,355 A | 3/2000 | Tseng et al. | |
| 6,079,100 A * | 6/2000 | Farquhar et al. | 29/852 |
| 6,129,145 A | 10/2000 | Yamamoto et al. | |
| 6,181,556 B1 | 1/2001 | Allman | |
| 6,190,941 B1 | 2/2001 | Heinz et al. | |
| 6,201,300 B1 | 3/2001 | Tseng et al. | |
| 6,201,701 B1 | 3/2001 | Linden et al. | |
| 6,212,071 B1 | 4/2001 | Roessler et al. | |
| 6,219,246 B1 | 4/2001 | Edevold et al. | |
| 6,226,178 B1 | 5/2001 | Broder et al. | |
| 6,377,457 B1 * | 4/2002 | Seshan et al. | 361/690 |
| 6,414,847 B1 | 7/2002 | Hutchison et al. | |
| 6,525,942 B2 * | 2/2003 | Huang et al. | 361/704 |
| 6,665,185 B1 * | 12/2003 | Kulik et al. | 361/699 |
| 6,670,699 B2 * | 12/2003 | Mikubo et al. | 257/678 |
| 6,752,966 B1 * | 6/2004 | Chazan | 422/102 |
| 6,810,583 B2 * | 11/2004 | Carpenter et al. | 29/852 |
| 6,865,200 B2 * | 3/2005 | Takigawa et al. | 372/35 |
| 6,879,486 B1 | 4/2005 | Banton et al. | |
| 6,930,257 B1 * | 8/2005 | Hiner et al. | 174/262 |
| 7,119,284 B2 | 10/2006 | Bel et al. | |
| 7,176,382 B1 | 2/2007 | Shi et al. | |
| 7,215,547 B2 * | 5/2007 | Chang et al. | 361/701 |
| 7,227,257 B2 | 6/2007 | Kim et al. | |
| 7,298,623 B1 * | 11/2007 | Kuczynski et al. | 361/719 |
| 7,303,862 B2 * | 12/2007 | David | 430/322 |
| 7,309,467 B2 * | 12/2007 | Chen et al. | 422/100 |
| 7,432,592 B2 * | 10/2008 | Shi et al. | 257/714 |
| 7,479,013 B2 * | 1/2009 | Takezaki et al. | 439/55 |
| 2006/0249279 A1 * | 11/2006 | Chordia et al. | 165/80.4 |

FOREIGN PATENT DOCUMENTS

| | | | |
|---|---|---|---|
| EP | 000844808 A2 * | 5/1998 | |
| JP | 02007027570 A * | 2/2007 | |

* cited by examiner

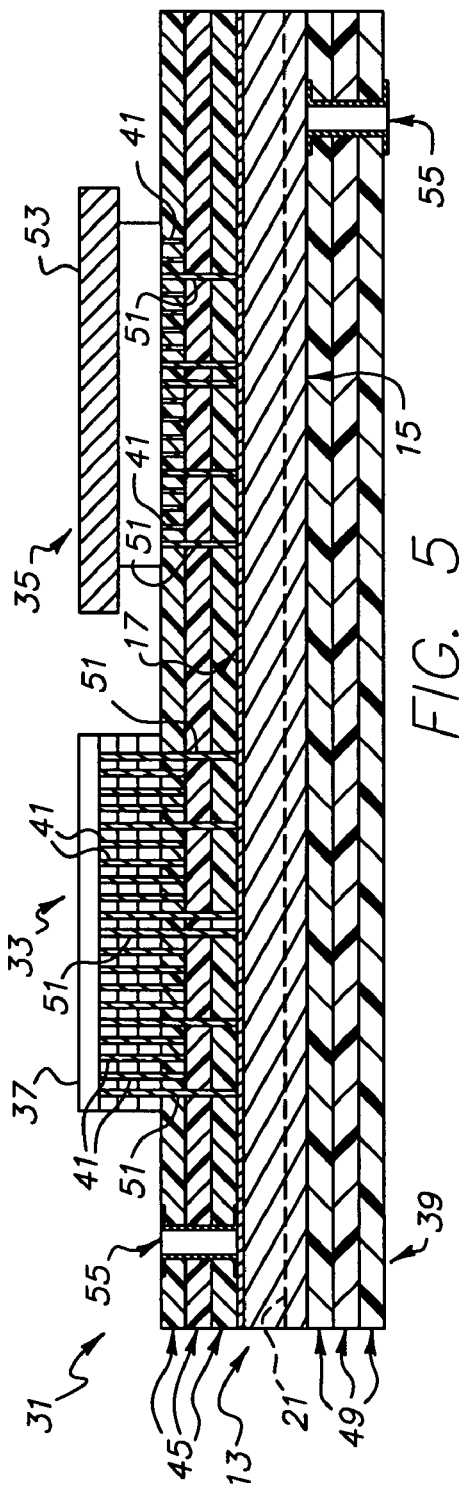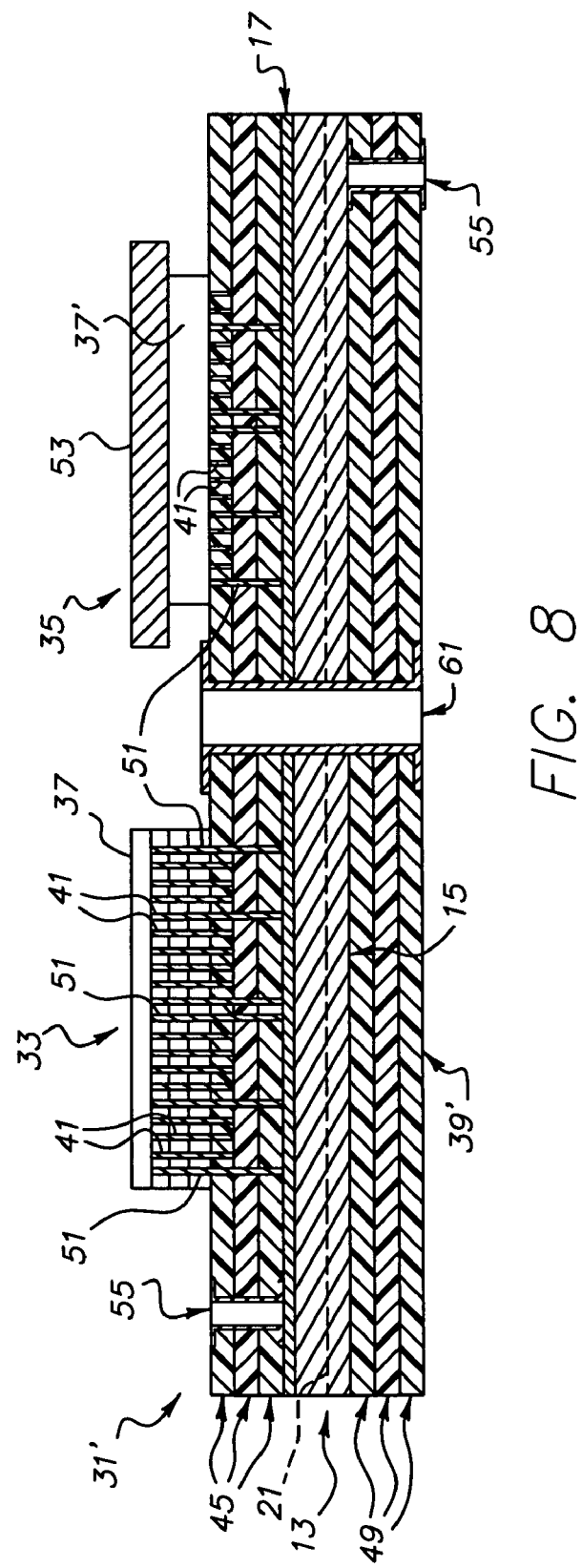

CIRCUITIZED SUBSTRATE WITH INTERNAL COOLING STRUCTURE AND ELECTRICAL ASSEMBLY UTILIZING SAME

TECHNICAL FIELD

The present invention refers to circuitized substrates such as printed circuit boards and chip carriers, and more particularly to such substrates which include internal cooling means as part thereof. The invention further relates to electrical assemblies designed to utilize such substrates.

BACKGROUND OF THE INVENTION

One major concern with respect to circuitized substrates adapted for working with electronic components (devices) such as semiconductor chips, modules, resistors etc. involves the effective dissipation of heat generated by such components. In many of today's substrate designs, such components are mounted on one or more external surfaces of the substrate and electrically coupled to selected internal circuitry, e.g., using plated through holes (PTHs). In some more recent products, components such as resistors, capacitors and even semiconductors, are incorporated within the substrate itself. Because today's technology often demands the use of many such components, including those required to operate at even greater capacities, increasing amounts of heat are being generated. To accommodate this, the use of dissipating heat sinks and the like structures have been used. These typically consist of projecting elements (e.g., fins) of a sound heat conductive material (e.g., aluminum or copper) which are thermally connected, either directly or indirectly, to the heat generating components or to a supporting member for same. These projections offer a relatively large surface area exposed to the product's ambient, across which cooling air may be directed to enhance heat removal. Examples of such heat sinks are described in U.S. Pat. Nos. 5,875,097, 6,181,556 and 6,219,246, listed below. U.S. Pat. No. 6,181,556, in particular, discloses an apparatus for electronic device heat dissipation consisting of a combination of heat sinks provided with fins, arranged so as to encircle the component to be cooled and thermally connected together by means of thermal bridge elements, these heat sinks being submitted to an airflow generated by several fans.

Utilization of heat pipes is also known for maintaining electronic components at suitable working temperatures. A heat pipe typically comprises a span of pipe closed at its ends and partially filled with heat-carrying fluid, the pipe comprising at least one evaporation region located close to or in contact with the heat source and at least one condensation region, for example, exposed to air which circulates the product in question. U.S. Pat. No. 6,226,178 listed below describes one embodiment of such a heat pipe. One drawback of a heat pipe system such as described in U.S. Pat. No. 6,226,178 is that the evaporation region is in contact with the single component or with an auxiliary board on which the component is assembled, but it does not effectively cool the entire printed circuit board on which a plurality of heat generating components are assembled.

One technology which provides a relatively high degree of heat dissipation for components of a circuit is referred to as the printed circuit board with insulated metal substrate technology, such technology commonly referred to in the art simply as IMS. A typical printed circuit board with insulated metal substrate comprises at least one metal support substrate, generally of an aluminum alloy, on which the electroconducting circuit tracks, generally copper, are adhered by means of a layer of electrically insulating material which is the best possible heat conductor. With this arrangement, part of the heat generated by the components is dissipated through the metal substrate, which acts like a heat sink. However, in some power applications such as a control and distribution box in an automobile, the heat dissipation provided by the insulated metal substrate technology may be insufficient to ensure that a deterioration or malfunction of the circuit does not occur due to thermal fatigue.

Other approaches have been utilized to provide heat transference from heat-generating components utilized on or within circuitized substrates such as printed circuit boards. The following patents describe various ways, including those mentioned above, in which heat is withdrawn from electronic components used in conjunction with a printed circuit board. The list is not meant to be an exhaustive one of all possible structures, nor is it acknowledged that any of the listed documents are prior art to the present invention.

In U.S. Pat. No. 4,706,164, there is described a printed circuit card with a built-in heat exchanger. The card includes a mono- or multilayer circuit and heat drain integrated together, and having a system of channels for circulation of a heat-carrying fluid. The channels are formed on a plate and are enclosed by a closure plate.

In U.S. Pat. No. 5,875,097, a heat sink is mounted on a back plane of an auxiliary circuit board and the auxiliary circuit board is mounted on a main circuit board. In one embodiment, the heat sink is planer and extends between parallel auxiliary and main circuit boards. A finned heat dissipating member is at one side of the planar portion. Mounting pins in channels mount the heat sink to the main circuit board. The second embodiment is unshaped and stands on edge to mount the auxiliary circuit board perpendicular to the main circuit boards. Mounting pins in channels of the second embodiment likewise mount the heat sink to the main circuit board.

In U.S. Pat. No. 5,929,518, there is described a circuit board and method of transporting a conduction medium through the board for operating a semiconductor device supported on a surface of the board. A medium transport cavity is formed in the circuit board such that a portion runs parallel to the surface, and therefore has a length greater than the thickness of the board. The conduction medium can include air, a coolant fluid, or an optical fiber, which can transport energy such as pressure/vacuum, sound, heat or light from an external source to the semiconductor device.

In U.S. Pat. No. 5,998,240, there is described the cooling of densely packaged semiconductor devices in which micro channels extract heat by forced convection and fluid coolant is used as close as possible to the heat source. The micro channels maximize heat sink surface area and provide heat transfer, thereby allegedly allowing a higher power density of semiconductor devices without increasing junction temperature or decreasing reliability. In one embodiment, a plurality of micro channels is formed directly in the substrate portion of a silicon or silicon carbide chip or die mounted on a ground plane element of a circuit board where a liquid coolant is fed to and from the micro channels through the ground plane. The micro channels comprise a plurality of closed-ended slots or grooves of generally rectangular cross section. Fabrication methods include deposition and etching, lift-off processing, micromachining and laser cutting techniques.

In U.S. Pat. No. 6,032,355, there is described a method of manufacturing a thermal conductive structure on a printed circuit board which includes the steps of forming a thermal conductive layer having an embossed pattern on its surface, and then forming an adhesive glue layer over the thermal conductive layer. Next, a surface metallic layer is attached to the thermal conductive layer and the glue layer, wherein a portion of the surface metallic layer corresponding to the embossed portion of the heat spreader is in direct contact or almost direct contact with the thermal conductive layer. Furthermore, an additional external heat sink can be attached to thermal conductive structure for increasing the efficiency of heat dissipation.

In U.S. Pat. No. 6,129,145, there is described a heat dissipater which includes a heat-conductive substrate, a lid and a heat-conductive cover layer, and a coolant groove for passing a coolant there through. The groove is formed on a surface of the substrate. The lid is positioned on the coolant groove to seal the same, and the cover layer covers the surface of the substrate and the lid. The lid may be received in a lid groove to be flush with the surface. The substrate, lid and cover layer are all made of diamond, and are joined together with substantially no other material there between. Thus, high heat conductivity is achieved. The heat dissipater can be a heat dissipating substrate for an electronic component, or an optical transmission window.

In U.S. Pat. No. 6,181,556, there is described a thermally-coupled heat-dissipation apparatus which surrounds a solid state electronic device mounted on an adapter circuit board or a thermal transfer column extending upwardly from a main board socket device. The apparatus includes at least two heat sinks positioned in a spaced parallel relationship on front and back sides of the adapter circuit board or thermal transfer column. A bridge member thermally couples the two heat sinks. A plurality of fans is mounted along outer surfaces of the heat sinks. In one embodiment, the bridge member is an additional heat sink, but could be a metal plate.

In U.S. Pat. No. 6,190,941, there is described an electronic component which is mounted on a substrate such as a circuit board by means of a soldering process such as reflow soldering. The circuit board has a thermal via hole there through to provide a heat dissipation path from the top surface to the bottom surface of the circuit board, for dissipating heat from the electronic component. To prevent molten solder from penetrating through the via hole during the soldering process, the via hole is sealed prior to the soldering process. The via hole is sealed from the bottom surface of the substrate by carrying out a screen printing process including at least two printing passes to print a sealing material into the open hole of the thermal via.

In U.S. Pat. No. 6,201,300, there is described a printed circuit board thermal conductive structure which comprises a thermal spreader layer having an embossed pattern formed on its surface, an adhesive glue layer formed over the thermal spreader, and a surface metallic layer attached to the thermal spreader and the glue layer. A portion of the surface metallic layer is in direct contact or almost direct contact with the thermal spreader. Furthermore, an additional external heat sink can be attached to thermal conductive structure to increase the efficiency of heat dissipation.

In U.S. Pat. No. 6,201,701, there is described a substrate having a heat sink base and a multilayer circuit board bonded thereto, the multilayer circuit board having the capability to interconnect both power and control semiconductor elements and efficiently dissipate heat there from. A thermally conductive and electrically insulating bonding material having excellent thermal properties bonds the multilayer circuit board to the base. One or more thick electrically conductive foil patterns are formed intermediate the top surface of the circuit board and the heat sink base, the thick foil pattern(s) adapted to interconnect high power semiconductor elements. Also included intermediate the top surface of the circuit board and the heat sink base are one or more interconnect patterns. The substrate allegedly provides a compact density of control and power elements in one small module, while exhibiting good thermal properties so that heat generated by power semiconductors connected to the substrate can be dissipated.

In U.S. Pat. No. 6,212,071, there is described the use of several tracks of a heat conducting material embedded on a conventional printed circuit board and thermally connected on one end to those areas or components of the board where heat is generated and, on the other end, on the edge of the board to several external dissipaters, such as a metal casing encircling the board. These heat conducting tracks can be formed in a manner that is analogous to the electro-conducting tracks on a multi-layer board, in which case these would be of copper. These may also be formed by drilling several holes from the edge of the board and filling the holes with a melted metallic material, such as welding material. This patent also suggests that conventional heat pipes may be used.

In U.S. Pat. No. 6,219,246, there is described a heat sink apparatus for drawing heat from one or more devices and a method of attaching such a heat sink to one or more devices. The heat sink includes a mounting surface, which draws heat into the heat sink where it is dissipated by fins. The heat sink can be mounted next to the device to be cooled with minimum insertion force since the weight of the heat sink is borne by the printed circuit board upon which the electronic device is installed. A rotatable cam is turned by the user, which engages a pivot arm. The pivot arm rotates a number of spring clips against the device thereby holding it in place. Once in a fully closed position, the cam locks into place to prevent the pivot arm and spring clips from rotating back to an open position. The spring clips affix the heat sink and maintains contact between the mounting surface and the device being cooled. The individually articulated spring clips allow the heat sink to be mounted over multiple devices of various dimensions and locations along the heat sink.

In U.S. Pat. No. 6,226,178, there is described a computer including a microprocessor, an input coupled to provide input to the microprocessor, a mass storage coupled to the microprocessor and a memory coupled to the microprocessor to provide storage to facilitate execution of computer programs by the microprocessor. A heat pipe including spaced apart condenser regions and an evaporator region disposed between the condenser regions is provided. The evaporator region is positioned adjacent the microprocessor. A first heat dissipating device is attached to the heat pipe adjacent a first one of the condenser regions. A second heat dissipating device is attached to the heat pipe adjacent a second one of the condenser regions. The second heat dissipating device is of a different type than the first heat dissipating device.

In U.S. Pat. No. 6,414,847, there is described a integral dielectric heat spreader for transferring heat from semiconductor devices. A semiconductor device is mounted to a thermally conductive electrically insulating substrate, which forms the integral dielectric heat spreader. The heat spreader is then mounted to a package or a lower cost substrate such as a printed circuit board. The integral dielectric heat spreader may also support integral transmission lines, resistors, capacitors, or other bulk components. Performance of the heat spreader is enhanced through the use of thermal vias on a printed circuit board.

In U.S. Pat. No. 6,879,486, there is described a circuit board assembly which includes a cover or other member disposed adjacent the substrate and, for example, spaced there from so as to define a plenum. Self-aligning heat sinks (or other heat dissipative elements) are spring-mounted (or otherwise resiliently mounted) to the cover and, thereby, placed in thermal contact with one or more of the circuit components. Flow-diverting elements are provided, e.g., so that the overall impedance of the board substantially matches that of one or more of the other circuit boards in a common chassis. The circuit board cover can be adapted to provide thermal and/or electromagnetic emission control, as well as shock and vibration. A connector arrangement provides electrical, mechanical and/or other operational coupling between the circuit board and a chassis regardless of whether the board is disposed in a slot on a first (upper) side of a source of cooling air for the chassis or on a second (lower) side of this source. A circuit board can have one or two portions, each with an air flow inlet edge through which cooling air flow is received and an air flow outlet edge through which the air flow exists. A chassis for mounting of such circuit boards may have a center air inlet. It may also have a circuit-board insertion slot with a first air flow aperture disposed adjacent a first edge of an inserted circuit board and a second aperture disposed adjacent a second edge of the board. These apertures can be sized so that the impedance to air flow to a circuit board inserted in the slot substantially matches that to one or more other boards in the chassis. Such slots can form part of a card cage that is vacuum or dip brazed, or manufactured by an alternate process yielding a cage of desired structural stiffness and airflow/interference sealing. The circuit boards and chassis can include an air and/or electromagnetic interference (EMI) seal which forms as the circuit board is inserted into the chassis slot.

In U.S. Pat. No. 7,119,284, there is described a printed circuit board having an insulated metal substrate with integrated cooling. The system includes a metal substrate, at least one electrically insulating layer adhered to the metal substrate and several electro-conducting tracks capable of interconnecting electronic power components, adhered to the electrically insulating layer. The metal substrate incorporates several heat transporting channels comprising several conduits for a heat-carrying fluid, conduits which extend to the outside of the metal substrate up to a heat transfer area to an outside medium.

In U.S. Pat. No. 7,176,382, there is described a multi-layer circuit board with heat pipes and a method for forming such a multi-layer circuit board. The method includes forming channels in a first and second pre-circuit assembly and attaching the first pre-circuit assembly to the second pre-circuit assembly such that the channels cooperatively form a heat pipe.

In U.S. Pat. No. 7,227,257, there is described an apparatus used for the cooling of active electronic devices utilizing micro channels or micro trenches, and a technique for fabricating the same. The micro channels run within a substrate and a stop layer, e.g., of diamond, is used in contact with (and even bound) the micro channels. Fluid passes through the micro channels and enters and exits the package.

As will be defined herein, the present invention represents a new and unique means for providing removal of heat from electronic components used in conjunction with a circuitized substrate. The thermal conductor used for this purpose may be formed as an integral part of the substrate and thermally coupled to one or more components. It may also be used as a common conductor if plating is used as part of the process of making the substrate. The process and resulting product as defined herein is of relatively low cost because it utilizes many processes known in the PCB art. It is even possible to use the invention in substrates having two opposing sides, each with one or more components mounted thereon.

It is believed that such a method and circuitized substrate would constitute significant advancements in the art.

OBJECTS AND SUMMARY OF THE INVENTION

It is, therefore, a primary object of this invention to enhance the art of circuitized substrates and the art of electrical assemblies which utilize such substrates.

It is a further object of this invention to provide a new electrical assembly including a circuitized substrate as defined herein with enhanced cooling capabilities.

It is another object of this invention to provide a new method of making such a circuitized substrate and assembly.

According to one aspect of the invention, there is provided an electrical assembly comprising a circuitized substrate including a first plurality of dielectric and electrically conductive circuit layers alternatively oriented in a stacked orientation, a thermal cooling structure bonded to one of the dielectric layers and at least one electrical component mounted on the circuitized substrate. The circuitized substrate includes a plurality of electrically conductive and thermally conductive thru-holes located therein, selected ones of the thermally conductive thru-holes thermally coupled to the electrical component and extending through the first plurality of dielectric and electrically conductive circuit layers and being thermally coupled to the thermal cooling structure, each of these selected ones of thermally conductive thru-holes adapted for providing a thermal path from the electrical component to the thermal cooling structure, the thermal cooling structure being adapted for having cooling fluid pass there-through during operation of the assembly.

According to another aspect of the invention, there is provided a method of making a circuitized substrate comprising providing a dielectric layer, forming a thermal cooling structure on this dielectric layer, bonding a first plurality of dielectric and electrically conductive circuit layers atop the thermal cooling structure such that the first plurality of dielectric and electrically conductive circuit layers are alternatively oriented in a stacked orientation, forming a plurality of electrically conductive thru-holes within selected ones of the first plurality of dielectric and electrically conductive circuit layers, and forming a plurality of thermally conductive thru-holes within the first plurality of dielectric and electrically conductive circuit layers, the plurality of thermally conductive thru-holes being thermally coupled to the thermal cooling structure and adapted for providing a thermal path from at least one electrical component to the thermal cooling structure when the electrical component is mounted on the circuitized substrate, the thermal cooling structure adapted for having cooling fluid pass therethrough during operation of the electrical component on the circuitized substrate.

BRIEF DESCRIPTION OF THE DRAWINGS

FIG. 5 is a side elevational view, in section, illustrating an electrical assembly according to one embodiment of the invention, the assembly including as part thereof a circuitized substrate also according to one embodiment of the invention;

FIG. 8 is a side elevational view, in section, illustrating an electrical assembly according to another embodiment of the invention, the assembly including as part thereof a circuitized substrate also according to one embodiment of the invention;

BEST MODE FOR CARRYING OUT THE INVENTION

Figure 1:
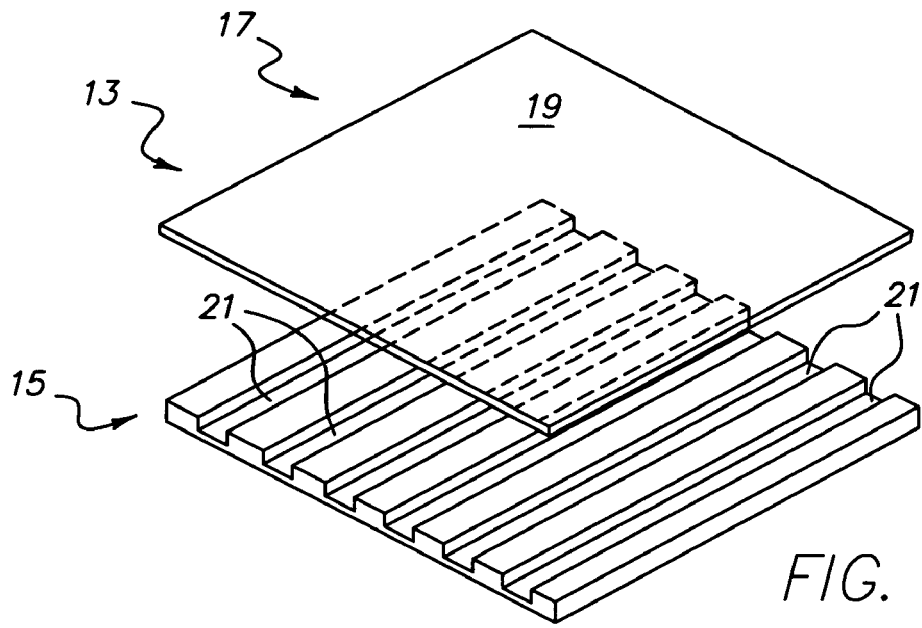
FIG. 1 is a perspective view of a thermal cooling structure according to one aspect of this invention.

For a better understanding of the present invention, together with other and further objects, advantages and capabilities thereof, reference is made to the following disclosure and appended claims in connection with the above-described drawings. Like figure numbers may be used from drawing figure to drawing figure to identify like elements in these drawings.

By the term "circuitized substrate" as used herein is meant to include substrates having at least two (and preferably more) dielectric layers and at least two (and preferably more) metallurgical electrically conductive layers, in addition to at least one thermal cooling structure as part thereof. Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be applied as dry film. Final cure of the photo-imageable material provides a toughened base of dielectric on which the desired electrical circuitry is formed. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such as chip carriers, semiconductor chips, etc. mounted thereon and coupled to the internal circuitry of the PCB.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system in which the substrate is positioned.

By the term "electrically conductive thru-hole" as used herein is meant to include what are also commonly referred to in the industry as "blind vias" which are openings typically from one surface of a circuitized substrate to a predetermined distance therein, "internal vias" which are vias or openings located internally of the substrate and are typically formed within one or more internal layers prior to bonding (e.g., lamination) thereof to other layers to form the ultimate structure, and "plated through holes" (also known as PTHs), which typically extend through the entire thickness of a circuitized substrate. All of these various openings form electrical paths through the substrate and often include one or more conductive layers, e.g., plated copper, on the internal walls thereof. Such openings may also include a quantity of conductive paste or, still further, the paste may be in addition to the plated metal on the internal walls. These openings in the substrate are formed typically using mechanical drilling or laser ablation, following which the plating and/or conductive paste are added.

By the term "screen printing" as used herein is meant to include both screen and stencil printing processes as conventionally used today. These involve the use of a screen or stencil through which the desired material, in this case, thermal paste, is deposited, e.g., using a squeegee.

By the term "thermally conductive thru-hole" as used herein is meant to include openings within a circuitized substrate which may be similar in location within the substrate as the above mentioned "blind vias", "internal vias" and PTHs, but which are designed for the purpose of conducting heat from one part of the substrate to another (in this case, one receiving location being the invention's thermal conductive member). These may or may not also be electrically conductive as the thermal conductor used in same might not also be able to effectively conduct electricity in accordance with the demands of such circuitized substrates as formed herein. Depending on the type of such opening, these may be formed within one or more internal layers prior to bonding (e.g., lamination) thereof to other layers to form the ultimate structure. If extending entirely through the substrate, these may be formed following completion of bonding of all of the substrate's layers. All of these various openings form thermal paths through the substrate and, like electrically conductive thru-holes, may include one or more conductive layers, e.g., plated copper, on the internal walls thereof. Such openings may instead include a quantity of thermal paste, or, still further, the openings may include both plated internal walls and thermal paste. These openings in the substrate may also be formed using mechanical drilling or laser ablation, following which the thermal paste is deposited therein, e.g., using needle dispensing equipment or, preferably, a screen printing or the like operation.

Figure 2:
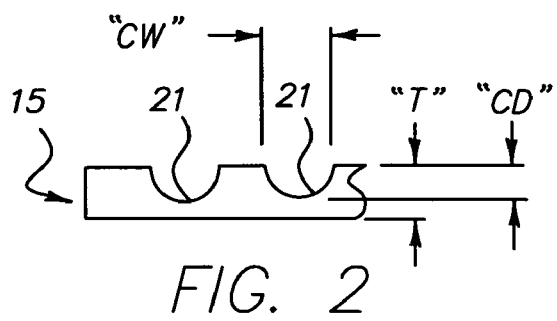
FIGS. 2 and 3 are partial end views of alternative channel structures usable in a thermal cooling structure of this invention, both of these views on a larger scale than FIG. 1.
Figure 3:
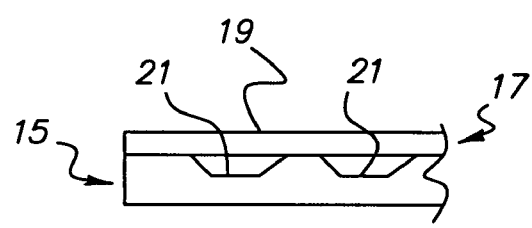

In FIG. 1 there is shown a thermal cooling structure 13 according to one embodiment of the invention. Structure 13 is designed for being incorporated within a substrate to form a means for providing cooling of the substrate, and particularly of electrical components mounted thereon and electrically coupled thereto. Such substrates, referred to herein as circuitized substrates, include additional dielectric and conductive layers as part thereof, as will be described in greater detail herein. Structure 13 includes a base member 15 and a cover 17 in the form of a layer 19. Base member 15 includes a plurality of channels 21 extending from one side to the other opposite side within the top surface thereof as shown. These longitudinal channels may be of rectangular configuration when viewed in cross-section or from one of the sides (as shown in FIG. 1), or of a partially round configuration (FIG. 2), or of a trapezoidal configuration (FIG. 3). Other configurations are also possible. In one embodiment, base member 13 has an overall thickness (dimension "T" in FIG. 2) of seventy mils (a mil being 1/1000 of an inch) with the corresponding channels 21 being formed to a depth of thirty mils (dimension "CD" in FIG. 2). Such channels may each have an overall width (dimension "CW" in FIG. 2) of about 100 mils. In this embodiment, cover 17 may have a thickness of from about ten mils to about thirty mils. As shown in FIG. 3, cover 17 is adapted for being aligned with and positioned on the underlying base member 15 such that the cover provides a cover for each of the longitudinal channels 21, thus defining the upper "wall" (or top) of each channel. Thermal cooling structure 13 may be of metal material, such as copper or aluminum, or alloys of either metal, or may be of the exceptional conductor aluminum nitride. Other sound thermally conducting materials are also possible.

As seen in FIG. 1, cooling structure 13, including both the base member 15 and cover 17, is substantially rectangular in shape, to accommodate the corresponding shape of the dielectric and conductive layers which will be bonded thereto during formation of the circuitized substrate. Thus, this structure may be incorporated within substrates of many different sizes, including many large board designs of demand today as well as for miniaturized substrates also in high demand. In one embodiment, for example, the structure 13 may include as many as five channels per linear inch (as viewed from the lower left of structure 13 in FIG. 1, facing the channels 21 in front elevation) or perhaps even fewer for larger boards, and as many as ten channels per linear inch for much smaller substrates. The invention is not limited to these numbers, of course. Further, the channels are shown herein as being positioned immediately adjacent one another, in a continuous pattern across the width of the base member. This is also not necessary, as it may be desirable to provide open spacings between selected ones of the channels, or even to limit a grouping of channels to a selected area on the base, with the remainder of the base being void of channels or the like. The channel location is dependent on the orientation of the electrical components on the substrate and the most effective means of providing thermal paths from same down to the structure 13. This is explained in greater detail herein-below.

Figure 4:
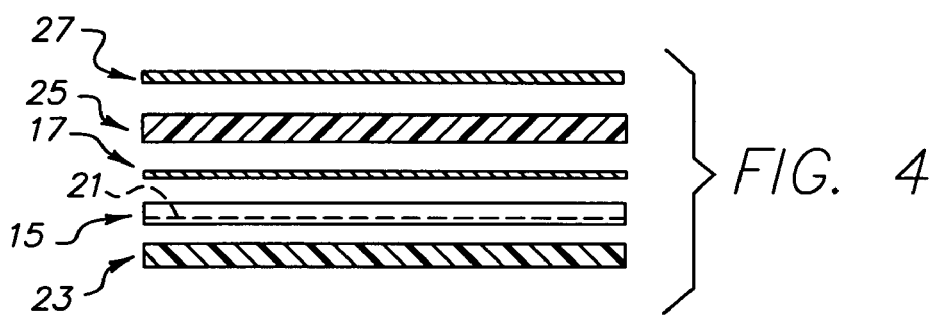
FIG. 4 is a side elevational view, in section and on a much reduced scale over the views of FIGS. 1-3, illustrating the stacking arrangement for various layers which may be used to make a circuitized substrate according to one embodiment of the invention, the substrate including a thermal cooling structure of FIG. 1 as part thereof.

In FIG. 4, there is shown an exploded view of various elements which might form the circuitized substrate of this invention, including the base member 15 and cover 17. In simplest form, a first dielectric layer 23 (preferably of one of the above materials) is positioned at the bottom with the base and the cover then oriented above this member. At least one more dielectric layer 25 is oriented above the cover 17, followed by a conductive layer 27 (also preferably of one of the above metals). The dielectric layers in this assembly may have a thickness of about five mils while conductive layer 27 may have a thickness of about 1.4 mils. Conventional thicknesses for these layers are known and further description not necessary. This stacked arrangement is then bonded together using conventional PCB lamination apparatus. In one example, a pressure of from about 500 pounds per square inch (PSI) to about 700 PSI, a temperature of from about 180 degrees C. to about 200 degrees C., and a time period of about sixty minutes to about 120 minutes may be used to bond all of the elements shown in FIG. 4. In this simplest form, the conductive layer 27 may then be "circuitized" using conventional circuitization processing known in PCB manufacture, one of the most commonly known involving photolithographic processing. Further definition is not considered necessary. This upper circuit is then adapted for having one or more electrical components mounted thereon and coupled to the formed substrate, e.g., for being interconnected to one another as well as to other components such as may also be coupled to the final substrate. In the most preferred embodiments of this invention, a first plurality of at least three dielectric layers and perhaps as many conductive layers (e.g., one on each of the dielectric layers) are utilized above the thermal cooling structure, and in such an arrangement, it is also possible (and perhaps desirable) to add a second plurality of dielectric and conductive layers on the underside of structure 13. In such an arrangement, all of these layers may be oriented such as for those shown in FIG. 4, and lamination then occurring. The number of layers shown in FIG. 4 is not limiting of this invention, as many more may be utilized, including over and under the invention's thermal cooling structure 13.

In FIG. 5, there is shown an electrical assembly 31 according to one embodiment of this invention. Assembly 31 includes a circuitized substrate in accordance with one embodiment of the invention and at least one electrical component mounted thereon. Actually, two components, 33 and 35, are shown in FIG. 5, both of which include may include one (as shown for component 35) or more semiconductor chips as part thereof. In this example, component 33 may be an "organic memory stack" comprised of an upper chip 37 with three organic memory substrates oriented in a layered stack arrangement there under, as shown. These three supporting organic substrates will typically include organic transistors (not shown) printed onto each substrate. Connections between the substrates may be accomplished standard drill and plate processes or by conventional "flip-chip" type processing. An alternative to this supporting organic memory stack is one using a stack of memory silicon dies, which in turn may be connected together using what is known as "Through-Silicon Via" (TSV) connections. Such TSV connections are accomplished by drilling holes into the silicon memory dies and connecting these holes using some type of electrical interconnect such as metal-filled adhesive. Alternatively, or the connecting "vias" may be filled with a suitable metal, e.g., tungsten, to provide the electrical connections desired. The partial, much larger in scale view in FIG. 6 better illustrates these individual elements and the corresponding upper layers of the substrate and attention is also directed thereto.

Figure 6:
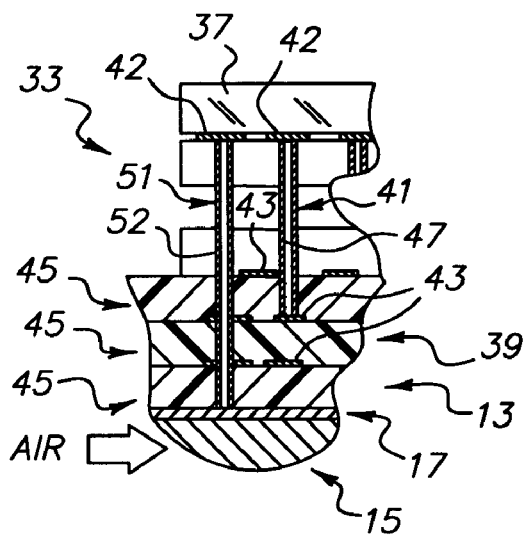
FIGS. 6 and 7 are side elevational views, in section and on a much enlarged scale over the view of FIG. 5, illustrating in greater detail parts of the structure of FIG. 5.

Component 33 is electrically coupled to selected ones of the conductive layers within the supporting substrate 39, using electrically conductive thru-holes 41, these being the shorter length holes shown in both FIGS. 5 and 6. Each thru-hole 41 may be electrically coupled to a pad or signal line (43, for hole 41 in FIG. 6) which is part of one of the conductive layers which in turn is atop one of the three dielectric layers 45 of a plurality of such layers in this upper part of substrate 39. Such holes 41 may be coupled to more than one conductor and not only to one as shown. Thru-hole 41 (and other similar thru-holes) is electrically coupled to a pad or similar contact site 42 (including possibly a connector such as a solder ball, not shown, which in turn is connected to site 42) of chip 37 and may be of conventional construction having plated metal (e.g., copper) sidewalls 47. It may be formed within the underlying substrate 39 following the above-defined lamination process. It is also possible to form such thru-holes 41 within each of the respective first plurality of dielectric layers and then laminate the layers as shown in FIG. 4. It is further possible to use conductive paste (not shown) within the electrically conductive thru-holes 41, in addition to the plating on the sidewalls or possible in lieu thereof. Such paste would be one of the preferred means to couple various conductors in a stacked arrangement of such layers where the thru-holes are formed prior to lamination.

Circuitized substrate 39 is shown in FIG. 5 to include both pluralities of dielectric and conductive layers on opposite sides (here, top and bottom) of the interim thermal cooling structure 13. Each of the lower plurality of this combination of dielectric layers is represented by the number 49, and is understood to possibly include a conductive layer thereon much the same as selected ones of the upper dielectric layers 45 may include. Selected ones of these conductive layers may include circuit pads, signal lines, or even be of solid construction (especially if serving as a ground layer), depending on the operational requirements for the substrate. The invention is thus not limited to single pads or the like as shown in the drawings.

In accordance with the teachings herein, the electrical components 33 and 35 are also thermally coupled to the invention's thermal cooling structure 13, and specifically to cover 17, by at least one (and possibly several) thermally conductive thru-holes 51. Thru-holes 51 may be of similar construction as thru-holes 41, thus rendering these also electrically conductive. Alternatively, thru-holes 51 may only include thermal paste 52 (partially shown in FIG. 6) therein without any metal plating or other conductive material as part thereof, thus rendering these thru-holes 51 only thermally conducting and not also electrically conducting. In the embodiment of FIG. 5, six thermally conductive thru-holes 51 are shown for component 33 while five are shown for component 35. In one embodiment, thru-holes 51 may possess a diameter of about eight mils to about twenty mils, while thru-holes 41 may possess diameters of about six mils to about twelve mils. If thru-holes 41 are of this dimension, and are plated, such platings may have a thickness of only about one mil to about two mils. It is understood that these dimensions are illustrative only and not limiting of the present invention. It is thus seen that thru-holes 51 provide thermal paths for heat generated by the components 33 and 35, and particularly the chips which form part thereof, to the invention's thermal cooling structure 13 whereupon cooling fluid (e.g., air or water) passing through the structure 13 will effectively provide cooling. In FIG. 6, one example (air) of cooling fluid is shown as entering the cooling structure to pass through the channels 21. Such air may be provided from a fan (not shown) or other suitable source. If water or other cooling liquid is provided, such may be provided by a pump (not shown) and provided through appropriate pipes (not shown) or other liquid couplings which in turn are connected to an end of cooling structure 13, e.g., using a suitable cement or connector.

Figure 7:
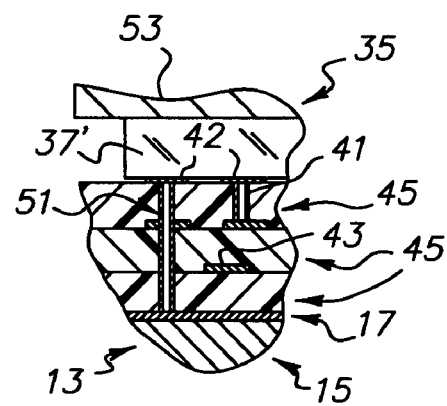

FIG. 7 represents the coupling both thermally and electrically of component 35, in one example a chip 37' having a heat sink 53 thereon, to thermal cooling structure 13. Such couplings are similar to those in FIG. 6 and further description is not considered necessary.

Thermally conductive thru-holes 51 may also provide circuit paths to the invention's thermal cooling structure 13, e.g., for providing an electrical ground for selected ones of the pads/sites 42. Thus, structure 13, if metal or other electrically conductive material, may also serve as a ground layer for electrical assembly 31. Notably, the presence of liquid such as water will not adversely affect such a capability. If structure 13 is to provide such a ground, it is also possible to provide additional electrical connections thereto. Examples of such connections include electrically conductive thru-holes 55 (two shown in FIG. 5) which may extend through all or only some of the various electrically conductive layers to electrically connect selected conductors (e.g., pads or lines) which form part thereof to the structure 13.

Figure 9:
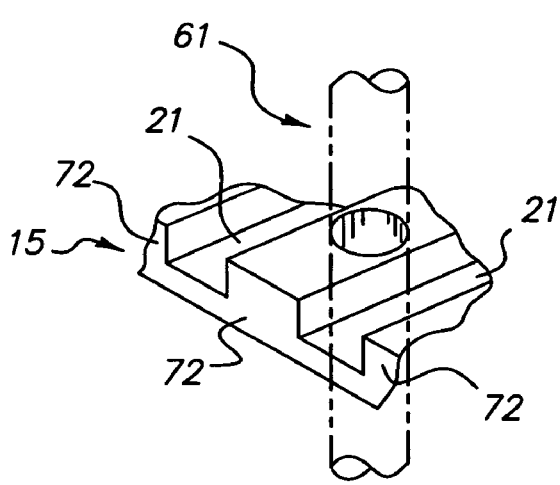
FIG. 9 is a partial perspective view, on a much enlarged scale over the view of FIG. 8, illustrating part of the structure in FIG. 8 in greater detail.
Figure 10:
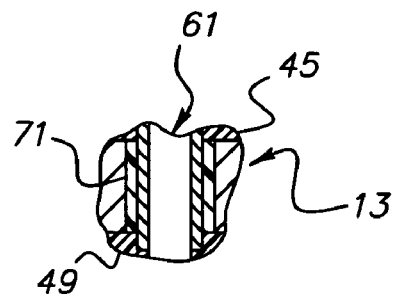
FIG. 10 is a partial view, in section, of an alternative embodiment of the thru-hole structure shown in FIG. 8.

The electrical assembly 31' of FIG. 8 is similar in structure and operation to assembly 31 in FIG. 5, including with respect to the thermal and electrical couplings of electrical components 33 and 35. As seen, assembly 31' includes a similar number of dielectric and electrically conductive layers as part of the circuitized substrate 39'. Substrate 39', however, also includes at least one (and more if needed) electrically conductive thru-hole 61 which extends through the entire thickness of substrate 39', to thus provide yet further options for circuitry within assembly 31'. Thru-hole 61 may serve to electrically connect selected ones of pads/lines on selected conductive layers of the upper (first) plurality (those above cooling structure 13) of conductive layers to selected ones of pads/lines on selected conductive layers of the lower (second) plurality (those below cooling structure 13) of conductive layers, thus assuring electrical connections through the invention's cooling structure. Such interconnections may also couple selected ones of the electrical components to selected components (not shown) on the opposite side of substrate 39', if such added components are used as part of assembly 31'. (The substrates of the assemblies taught herein are thus understood to have the capability to also include such additional electrical components on the lower, opposite side thereof from the upper plurality of components 33 and 35.) Thru-hole 61 may be electrically isolated from the cooling structure 13 by a layer of dielectric material 71, as shown in FIG. 10, or it may be electrically coupled to structure 13 as shown in FIG. 9. A possible approach for achieving a thru-hole with material 71 as shown is to drill a hole through the layered assembly (which understandably includes thermal cooling structure 13 therein), fill this hole with the dielectric material 71, cure the material, drill a second, smaller diameter hole through the cured dielectric, and then plate the second hole with the desired metallurgy. Thru-hole 61 may include plated internal sidewalls (as shown) and may further include electrically conductive paste (such as a conductive paste 52 shown in FIG. 6 which is of course electrically conductive) or may use only such conductive paste (no plated layer) as the electrically conductive means. This thru-hole 61, and others if utilized, may be formed similarly to thru-holes 41 and 51, by using mechanical drilling or a suitable (e.g., carbon dioxide) laser. It may be formed following formation of substrate 39' in which the several layers are bonded (e.g., laminated).

With particular attention to FIG. 9, when an electrically conductive thru-hole such as thru-hole 61 is extended through the substrate as shown in FIG. 8, it is preferred that this hole extend through a part of the base member 15 (and of course the cover 17, not shown in FIG. 9 for ease of illustration) other than one or more of the channels 21. In FIG. 9, it is seen that thru-hole 61 passes through one of the upstanding portions 72 of base member 15 adjacent the channels. This enables full passage of cooling fluid through all of the channels, while also assuring continuity of the metallurgy needed to form a complete electrical path at the cooling structure 13 location. Should a thru-hole 61 be passed through one of the channels, which is also possible using the teachings of this invention, it would be necessary to provide additional material within the thru-hole to fill at least part of the channel and on which a conductive layer (e.g., a plated metal layer) may then be formed. Alternatively, a conductive sleeve or like structure could be inserted within the drilled-out hole, including where said hole thereafter includes a plated layer on the internal sidewalls thereof as shown. Such thru-hole placement (within a channel 21) would of course restrict passage of cooling fluid through this particular channel, but it is understood that effective cooling is still possible using an adequate number of remaining cooling channels.

Thus there has been shown and described an electrical assembly and circuitized substrate for use therein in which the substrate includes a thermal cooling structure which is thermally coupled to selected ones of the electrical components of the assembly to thus provide cooling therefor. The assembly includes both thermally conductive thru-holes to provide such thermal couplings as well as electrically conductive thru-holes for interconnecting, electrically, selected conductive layers of the substrate and, if desired, such layers to the thermal cooling structure, e.g., if the cooling structure is to serve as an electrical ground. The substrate and assembly is designed to allow passage of cooling fluid such as air or water through channels within the structure, these channels in turn being defined by a cover which forms part of and which bonds to a base member which also forms part of the cooling structure. The base member includes the desired number of cooling channels therein. Significantly, the cooling structure is designed to be formed as part of the overall process for bonding the selected number of dielectric and electrically conductive layers which will eventually form part of the finished substrate. The method as defined herein to form the circuitized substrate thus utilizes many conventional processes used in known PCB manufacturing, thereby assuring relatively low costs for the finished product.

While there have been shown and described what at present are considered the preferred embodiments of the invention, it will be obvious to those skilled in the art that various changes and modifications may be made therein without departing from the scope of the invention as defined by the appended claims.

What is claimed is:

1. An electrical assembly comprising:
   a circuitized substrate including a first plurality of dielectric and electrically conductive circuit layers alternatively oriented in a stacked orientation, a thermal cooling structure directly laminated to at least one of said dielectric layers of said first plurality of dielectric and electrically conductive circuit layers;
   a second plurality of dielectric and electrically conductive circuit layers alternatively oriented in a stacked orientation, said second plurality of dielectric and electrically conductive circuit layers located on an opposite side of said thermal cooling structure from said first plurality of dielectric and electrically conductive circuit layers;
   at least one electrical component mounted on said circuitized substrate, said circuitized substrate including a plurality of electrically conductive and thermally conductive plated thru-holes located therein, selected ones of said thermally conductive plated thru-holes thermally coupled to said at least one electrical component and extending through said first plurality of dielectric and electrically conductive circuit layers and being thermally coupled to said thermal cooling structure, each of said selected ones of said thermally conductive plated thru-holes adapted for providing a thermal path from said at least one electrical component to said thermal cooling structure, said thermal cooling structure adapted for having cooling fluid pass therethrough during operation of said electrical assembly; and
   an electrically conductive plated thru-hole extending entirely through both said first plurality of dielectric and electrically conductive circuit layers and said second plurality of dielectric and electrically conductive circuit layers.

2. The electrical assembly of claim 1 wherein the number of dielectric layers is at least three.

3. The electrical assembly of claim 1 wherein said thermal cooling structure comprises a base member including a plurality of channels therein and a cover layer secured to said base member over said channels.

4. The electrical assembly of claim 3 wherein said thermal cooling structure comprising metal.

5. The electrical assembly of claim 4 wherein said metal is copper or copper alloy.

6. The electrical assembly of claim 4 wherein said metal is aluminum.

7. The electrical assembly of claim 3 wherein said thermal cooling structure comprising aluminum nitride.

8. The electrical assembly of claim 3 wherein said channels in said base member possess a cross-sectional configuration selected from the group consisting of rectangular, round and trapezoidal.

9. The electrical assembly of claim 1 wherein at least one of said electrically conductive thru-holes electrically couples said at least one electrical component to said thermal cooling structure to provide an electrical ground for said at least one electrical component.

10. The electrical assembly of claim 1 wherein said thermal cooling structure is adapted for having air passing therethrough as cooling fluid during said operation of said electrical assembly.

11. The electrical assembly of claim 1 wherein said thermal cooling structure is adapted for having water passing therethrough-as cooling fluid during said operation of said electrical assembly.

12. A method of making a circuitized substrate, said method comprising:
   providing a dielectric layer;
   forming a thermal cooling structure directly laminated on said dielectric layer;
   bonding a first plurality of dielectric and electrically conductive circuit layers atop said thermal cooling structure such that said first plurality of dielectric and electrically conductive circuit layers are alternatively oriented in a stacked orientation;
   bonding a second plurality of dielectric and electrically conductive circuit layers below said thermal cooling structure such that said second plurality of dielectric and electrically conductive circuit layers are alternatively oriented in a stacked orientation;
   forming a plurality of electrically conductive plated thru-holes extending entirely through both said first plurality of dielectric and electrically conductive circuit layers and said second plurality of dielectric and electrically conductive circuit layers; and
   forming a plurality of thermally conductive thru-holes within said first plurality of dielectric and electrically conductive circuit layers, said plurality of thermally conductive thru-holes being thermally coupled to said thermal cooling structure and adapted for providing a thermal path from at least one electrical component to said thermal cooling structure when said at least one electrical component is mounted on said circuitized substrate, said thermal cooling structure adapted for having cooling fluid pass therethrough during operation of said at least one electrical component on said circuitized substrate.

13. The method of claim 12 further including mounting said at least one electrical component on said circuitized substrate to form an electrical assembly.

14. The method of claim 12 wherein said forming of said thermal cooling structure on said dielectric layer is achieved by positioning a base member including a plurality of channels therein on said dielectric layer and then positioning a cover layer on said base member to cover said channels.

15. The method of claim 14 further including bonding said base member to said dielectric layer and bonding said cover layer to said base member.

16. The method of claim 15 wherein said bonding of said base member and said cover layer is achieved using lamination.

17. The method of claim 15 wherein said bonding of said first plurality of dielectric and electrically conductive circuit layers is achieved using lamination, said bonding of said base member and said cover layer being accomplished simultaneously with said bonding of said first plurality of dielectric and electrically conductive circuit layers.

18. The method of claim 12 wherein said forming of said thermally conductive thru-holes is accomplished using laser ablation.

19. The method of claim 12 wherein said forming of said thermally conductive thru-holes is accomplished using mechanical drilling.

20. The method of claim 12 wherein said forming of said electrically conductive thru-holes is accomplished using laser ablation.

21. The method of claim 12 wherein said forming of said electrically conductive thru-holes is accomplished using mechanical drilling.

22. The method of claim 12 further including depositing a thermal paste within said plurality of thermally conductive thru-holes.

* * * * *